US012375092B2

(12) United States Patent
Kuo et al.

(10) Patent No.: US 12,375,092 B2
(45) Date of Patent: Jul. 29, 2025

(54) SYNCHRONIZING SYSTEM FOR TIME SYNCHRONIZATION REQUIRED FOR DATA TRANSCEIVER CONTROL

(71) Applicant: MITAC COMPUTING TECHNOLOGY CORPORATION, Taoyuan (TW)

(72) Inventors: Chih-Ping Kuo, Taoyuan (TW); Chi-Hua Li, Taoyuan (TW)

(73) Assignee: MITAC COMPUTING TECHNOLOGY CORPORATION, Taoyuan (TW)

( * ) Notice: Subject to any disclaimer, the term of this patent is extended or adjusted under 35 U.S.C. 154(b) by 99 days.

(21) Appl. No.: 18/470,790

(22) Filed: Sep. 20, 2023

(65) Prior Publication Data
US 2024/0120928 A1 Apr. 11, 2024

(30) Foreign Application Priority Data
Oct. 6, 2022 (TW) .................................. 111138020

(51) Int. Cl.
*H03L 7/099* (2006.01)
(52) U.S. Cl.
CPC .................................... *H03L 7/099* (2013.01)
(58) Field of Classification Search
CPC .... H03L 7/099; H03L 7/06; G06F 1/14; H04J 3/0667; H04L 7/00
See application file for complete search history.

(56) References Cited

U.S. PATENT DOCUMENTS

| 2009/0034672 A1* | 2/2009 | Cho | G04R 20/06 342/357.44 |
| 2019/0007243 A1* | 1/2019 | Burbano | H03K 9/08 |
| 2021/0234625 A1* | 7/2021 | Mok | H04J 3/0658 |
| 2023/0337162 A1* | 10/2023 | Katko | H04W 56/0045 |
| 2025/0015915 A1* | 1/2025 | Kumar | H04J 3/0685 |

FOREIGN PATENT DOCUMENTS

| CN | 102868515 B | 4/2015 |
| TW | 201613394 A | 4/2016 |

OTHER PUBLICATIONS

Examination Report issued to Indian counterpart application No. 202314066693 by the Indian Patent Office on Apr. 17, 2025.(6 pages including English machine translation).

* cited by examiner

*Primary Examiner* — David S Huang
(74) *Attorney, Agent, or Firm* — Michael Best & Friedrich LLP

(57) ABSTRACT

A synchronizing system includes a phase-locked loop (PLL), first and second network controllers (NCs), a retimer and a processor. The PLL receives a local oscillator (LO) signal, generates and outputs a clock signal and a synchronizing signal. The retimer and the first and second NCs operate according to the clock signal. The first/second NC generates a first/second clock-event signal based on the synchronizing signal. The processor generates a first/second Precision Time Protocol (PTP) signal based on the first/second clock-event signal, and transmits the first/second PTP signal to the first/second NC. The second NC delivers the second PTP signal to first transceivers. The retimer performs retiming on the first PTP signal, and delivers the same to second transceivers. In a master mode, the PLL unit generates the synchronizing signal based on the LO signal and a reference time signal received from a global navigation satellite system (GNSS).

20 Claims, 3 Drawing Sheets

SYNCHRONIZING SYSTEM FOR TIME SYNCHRONIZATION REQUIRED FOR DATA TRANSCEIVER CONTROL

CROSS-REFERENCE TO RELATED APPLICATION

This application claims priority to Taiwanese Invention Patent Application No. 111138020, filed on Oct. 6, 2022.

FIELD

The disclosure relates to a synchronizing system, and more particularly to a synchronizing system that supports Precision Time Protocol (PTP) and that is used to implement time synchronization required for data transceiver control.

BACKGROUND

Protocols such as Network Time Protocol (NTP), Real-time Transport Protocol (RTP), and Precise Time Protocol (PTP) that is defined in the IEEE 1588 standard have been widely used to synchronize clocks throughout a computer network.

A conventional synchronizing system includes a digital phase-locked loop (PLL) unit, a single network controller, a retimer and a processor. The digital PLL unit generates and outputs a synchronization signal and a clock signal that has an operating frequency to the network controller. The single network controller operates according to the clock signal, performs synchronization based on the synchronization signal, and generates a clock-event every second to result in a clock-event signal. The processor generates a Precise Time Protocol (PTP) signal based on the clock-event signal, and outputs the PTP signal to the retimer. The retimer performs retiming on the PTP signal, and delivers the PTP signal that is retimed to multiple small form-factor pluggable (SFP) transceivers (e.g., SFP28 transceivers). In this way, external devices (e.g., a host server or networking equipment) electrically and respectively connected to the SFP transceivers are capable of performing synchronization based on the PTP signal that is retimed, so the external devices are synchronized with the conventional synchronizing system.

However, the conventional synchronizing system can only be electrically connected to four SFP transceivers at most.

SUMMARY

Therefore, an object of the disclosure is to provide a synchronizing system that is capable of being connected to more than four SFP transceivers, and that can alleviate at least one of the drawbacks of the prior art.

According to the disclosure, the synchronizing system includes a phase-locked loop (PLL) unit, a first network controller, a second network controller, a processor and a signal-adjusting device.

The PLL unit has a first pin, a second pin, a third pin and a fourth pin. The PLL unit is configured to receive a local oscillator signal, to generate and output a clock signal having an operating frequency, to generate a synchronizing signal, and to output the synchronizing signal via a combination of the first pin and the second pin and via a combination of the third pin and the fourth pin.

The first network controller is electrically connected to the PLL unit, and is configured to receive the clock signal and the synchronizing signal that is outputted via the combination of the first pin and the second pin of the PLL unit, to operate according to the clock signal, and to generate a first clock-event every second based on the synchronizing signal to result in a first clock-event signal.

The second network controller is electrically connected to the PLL unit, and is configured to receive the clock signal and the synchronizing signal, to operate according to the clock signal, and to generate a second clock-event every second based on the synchronizing signal to result in a second clock-event signal. The second network controller has two input pins respectively and electrically connected to the third pin and the fourth pin of the PLL unit for receiving the synchronizing signal.

The processor is electrically connected to the first network controller and the second network controller. The processor is configured to receive the first clock-event signal from the first network controller, to generate, based on the first clock-event signal, a first Precision Time Protocol (PTP) signal that contains a first timestamp related to PTP, to transmit the first PTP signal to the first network controller to enable the first network controller to output the first PTP signal, to receive the second clock-event signal from the second network controller, to generate, based on the second clock-event signal, a second PTP signal that contains the first timestamp, and to transmit the second PTP signal to the second network controller to enable the second network controller to deliver the second PTP signal to a plurality of first transceivers for synchronization.

The signal-adjusting device is electrically connected to the PLL unit and the first network controller. The signal-adjusting device is configured to receive the clock signal from the PLL unit and the first PTP signal from the first network controller, to operate according to the clock signal, to perform retiming on the first PTP signal, and to deliver the first PTP signal that is retimed to a plurality of second transceivers for synchronization.

When the synchronizing system operates in a master mode with respect to generation of the synchronizing signal, the PLL unit receives a reference time signal from a global navigation satellite system (GNSS), generates the synchronizing signal based on the local oscillator signal and the reference time signal, and outputs the synchronizing signal to the first network controller and the second network controller.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
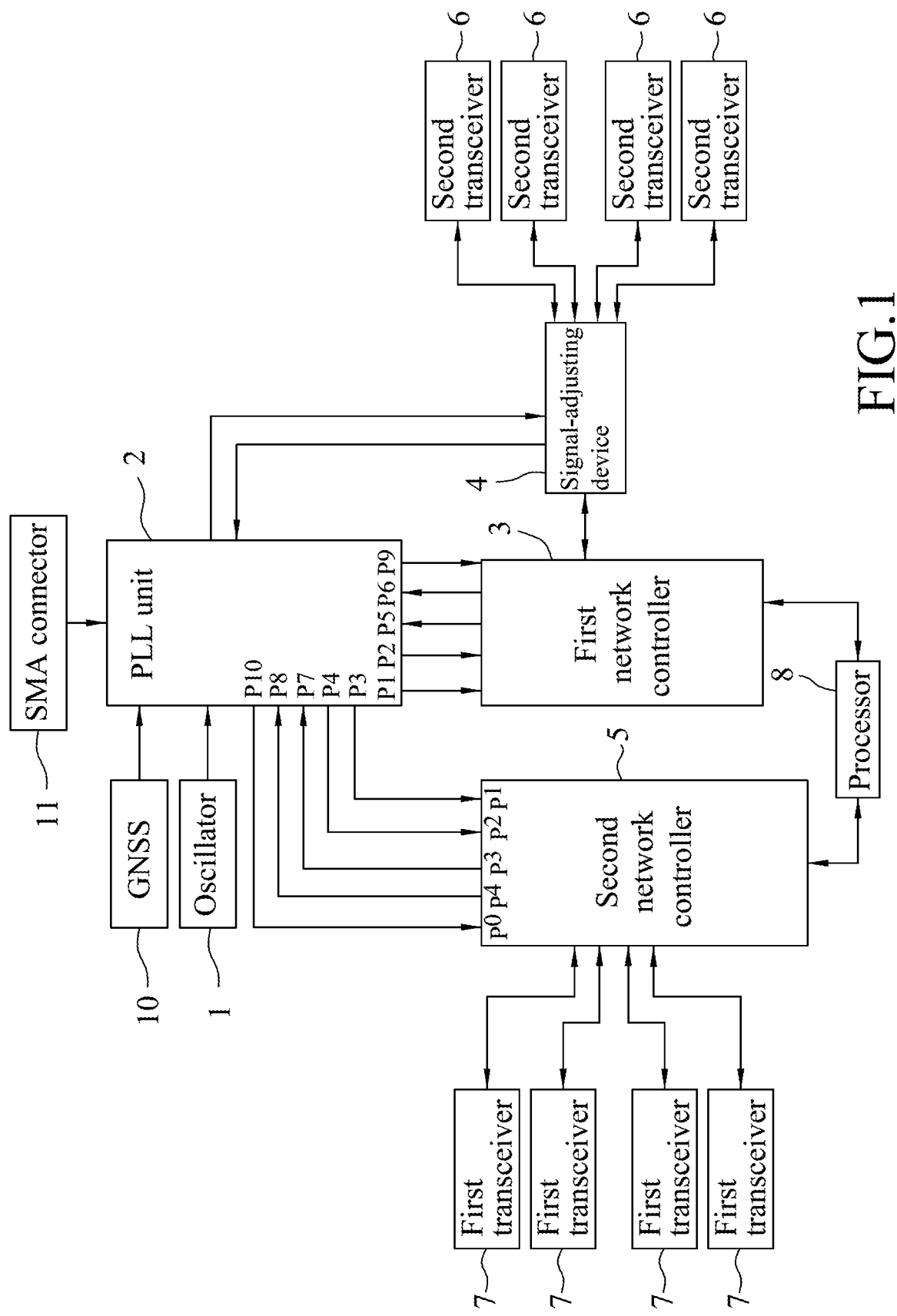
FIG. 1 is a block diagram illustrating an embodiment of a synchronizing system according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a synchronizing system according to the disclosure is illustrated. The synchronizing system is used to implement time synchronization required for data transceiver control. The synchronizing system includes an oscillator 1, a phase-locked loop (PLL) unit 2, a first network controller 3, a signal-adjusting device 4, a second network controller 5 and a processor 8. The oscillator 1, the first network controller 3 and the second network controller 5 are electrically connected to the PLL unit 2. The processor 8 is electrically connected to the first network controller 3 and the second network controller 5. The signal-adjusting device 4 is electrically connected to the PLL unit 2 and the first network controller 3. The second network controller 5 is further electrically connected to a plurality of first transceivers 7. The signal-adjusting device 4 is further electrically connected to a plurality of second transceivers 6.

Each of the first transceivers 7 and the second transceivers 6 is implemented by a small form-factor pluggable (SFP) transceiver (e.g., an SFP28 transceiver). Each of the first transceivers 7 and the second transceivers 6 can be used in fiber-optic communication, and is configured to be electrically connected to an external device, which may be a host server or networking equipment (e.g., a network switch). It should be noted that in one embodiment, a total number of the first transceivers 7 that are electrically connected to the second network controller 5 is not greater than eight, and a total number of the second transceivers 6 that are electrically connected to the signal-adjusting device 4 is not greater than four. However, in other embodiments, the numbers of the first transceivers 7 and the second transceivers 6 are not limited to the disclosure herein, and may be changed based on different needs and designs.

The oscillator 1 is configured to generate a local oscillator signal, and to output the local oscillator signal to the PLL unit 2. In this embodiment, the oscillator 1 is an oven controlled crystal oscillator (OCXO), but is not limited thereto.

The PLL unit 2 is configured to receive the local oscillator signal from the oscillator 1, to generate and output a clock signal having an operating frequency (e.g., 156.25 MHz), and to generate and output a synchronizing signal. In this embodiment, the PLL unit 2 is implemented by a digital phase-locked loop (DPLL). In particular, the PLL unit 2 has a first pin (P1), a second pin (P2), a third pin (P3), a fourth pin (P4), a fifth pin (P5), a sixth pin (P6), a seventh pin (P7), an eighth pin (P8), a ninth pin (P9), a tenth pin (P10), and miscellaneous pins (not shown). The first pin (P1), the second pin (P2), the fifth pin (P5), the sixth pin (P6) and the ninth pin (P9) are electrically connected to the first network controller 3. The third pin (P3), the fourth pin (P4), the seventh pin (P7), the eighth pin (P8) and the tenth pin (P10) are electrically connected to the second network controller 5. The PLL unit 2 outputs the synchronizing signal via a combination of the first pin (P1) and the second pin (P2) and via a combination of the third pin (P3) and the fourth pin (P4). The PLL unit 2 outputs the clock signal via each of the ninth pin (P9), the tenth pin (P10), and one(s) of the miscellaneous pins. The PLL unit 2 receives the local oscillator signal via one(s) of the miscellaneous pins. Details regarding generation of the synchronizing signal will be explained in later paragraphs.

Each of the first network controller 3 and the second network controller 5 is implemented by an Ethernet controller (e.g., Intel® E810-CAM1), but is not limited thereto.

The first network controller 3 is configured to receive the clock signal and the synchronizing signal that is outputted via the combination of the first pin (P1) and the second pin (P2) of the PLL unit 2, to operate according to the clock signal, and to generate a first clock-event every second based on the synchronizing signal to result in a first clock-event signal. On the other hand, the first network controller 3 has a software-defined pin 20 (SDP20, not shown) and a software-defined pin 22 (SDP22, not shown) that are respectively and electrically connected to the fifth pin (P5) and the sixth pin (P6) of the PLL unit 2.

The second network controller 5 is configured to receive the clock signal and the synchronizing signal that is outputted via the combination of the third pin (P3) and the fourth pin (P4) of the PLL unit 2, to operate according to the clock signal, and to generate a second clock-event every second based on the synchronizing signal to result in a second clock-event signal. In particular, the second network controller 5 has an input pin (p0) electrically connected to the tenth pin (P10) of the PLL unit 2 for receiving the clock signal. The second network controller 5 further has two input pins (p1, p2) respectively and electrically connected to the third pin (P3) and the fourth pin (P4) of the PLL unit 2 for receiving the synchronizing signal. The second network controller 5 further has two output pins (p3, p4) that are respectively and electrically connected to the seventh pin (P7) and the eighth pin (P8) of the PLL unit 2. The second network controller 5 further has miscellaneous pins (not shown) for other receiving and transmitting functions. It is worth to note that the input pins (p1, p2) of the second network controller 5 are respectively a software-defined pin 21 (SDP21) and a software-defined pin 23 (SDP23), and the output pins (p3, p4) of the second network controller 5 are respectively a software-defined pin 20 (SDP20) and a software-defined pin 22 (SDP22).

The processor 8 is configured to receive the first clock-event signal from the first network controller 3, to generate, based on the first clock-event signal, a first Precision Time Protocol (PTP) signal that contains a first timestamp related to PTP, and to transmit the first PTP signal to the first network controller 3 to enable the first network controller 3 to output the first PTP signal. Similarly, the processor 8 is configured to receive the second clock-event signal from the second network controller 5, to generate, based on the second clock-event signal, a second PTP signal that contains the first timestamp, and to transmit the second PTP signal to the second network controller 5 to enable the second network controller 5 to deliver the second PTP signal to the first transceivers 7 for synchronization. It is worth to note that the processor 8 executes a software program to generate the first PTP signal based on the first clock-event signal, and to generate the second PTP signal based on the second clock-event signal. In this embodiment, the software program is implemented by the PTP for Linux (ptp4l) open-source software.

The signal-adjusting device 4 is configured to receive the clock signal from the PLL unit 2 and the first PTP signal from the first network controller 3, to operate according to the clock signal, to perform retiming on the first PTP signal, and to deliver the first PTP signal that is retimed to the second transceivers 6 for synchronization. The signal-adjusting device 4 is implemented by a retimer that is capable of clock and data recovery (CDR).

With respect to generation of the synchronizing signal, the synchronizing system is configured to operate in one of a master mode and a slave mode. The synchronizing system operating in the master mode serves as a master that leads synchronization among the external devices, and each of the external devices connected to the synchronizing system serves as a slave that follows the lead of the master for synchronization. On the other hand, the synchronizing system operating in the slave mode serves as a slave, and each of external devices connected to the synchronizing system serves as a master that initiates the generation of the synchronizing signal by the synchronizing system and then proceeds to synchronize according to the synchronizing system. That is to say, the slave mode involves bidirectional communication for synchronization between the synchronizing system and the external devices.

When the synchronizing system operates in the master mode with respect to generation of the synchronizing signal, the PLL unit 2 receives a reference time signal (e.g., a pulse-per-second, 1PPS, signal) from a global navigation satellite system (GNSS) 10, generates the synchronizing signal based on the local oscillator signal and the reference time signal, and outputs the synchronizing signal to the first network controller 3 and the second network controller 5. Thereafter, a synchronization procedure is performed. It is worth to note that the PLL unit 2 receives the reference time signal via one(s) of the miscellaneous pins of the PLL unit 2. In one embodiment, the PLL unit 2 further receives another 1PPS signal via a subminiature version A (SMA) connector 11 from a signal source (e.g., a signal generator), and generates the synchronizing signal based on the another 1PPS signal, the local oscillator signal and the reference time signal.

In the synchronization procedure, the first network controller 3 generates the first clock-event every second based on the synchronizing signal received from the PLL unit 2 to result in the first clock-event signal, and outputs the first clock-event signal to the processor 8. The processor 8 generates the first PTP signal based on the first clock-event signal, and outputs the first PTP signal to the first network controller 3 to enable the first network controller 3 to transfer the first PTP signal to the signal-adjusting device 4. The signal-adjusting device 4 performs retiming on the first PTP signal, and delivers the first PTP signal that is retimed to the second transceivers 6. In this way, the external devices that are respectively and electrically connected to the second transceivers 6 can be synchronized, each based on the retimed first PTP signal that is received from the corresponding one of the second transceivers 6. In addition, the second network controller 5 generates the second clock-event every second based on the synchronizing signal received from the PLL unit 2 to result in the second clock-event signal, and outputs the second clock-event signal to the processor 8. The processor 8 generates the second PTP signal based on the second clock-event signal, and outputs the second PTP signal to the second network controller 5 to enable the second network controller 5 to deliver the second PTP signal to the first transceivers 7. In this way, the external devices that are respectively and electrically connected to the first transceivers 7 can be synchronized, each based on the second PTP signal that is received from the corresponding one of the first transceivers 7.

When the synchronizing system operates in the slave mode with respect to generation of the synchronizing signal, each of the external devices that are respectively and electrically connected to the second transceivers 6 outputs, to the synchronizing system, a third PTP signal that contains a second timestamp related to PTP, and each of the external devices that are respectively and electrically connected to the first transceivers 7 outputs, to the synchronizing system, a fourth PTP signal that contains a third timestamp related to PTP. In response to receipt of the third PTP signals from the second transceivers 6, the signal-adjusting device 4 performs retiming on the third PTP signals to result in a retimer signal, and generates, based on the third PTP signals, a recovered clock signal according to a Synchronous Ethernet (SyncE) standard. The first network controller 3 receives the retimer signal from the signal-adjusting device 4, and transfers the retimer signal to the processor 8. The processor 8 receives the retimer signal from the first network controller 3, generates a first 1PPS signal based on the retimer signal, and outputs the first 1PPS signal to the first network controller 3 to enable the first network controller 3 to transfer the first 1PPS signal to the PLL unit 2 via a combination of the SDP20 and SDP22 of the first network controller 3. On the other hand, in response to receipt of the fourth PTP signals from the first transceivers 7, the second network controller 5 transfers the fourth PTP signals to the processor 8. Similarly, the processor 8 receives the fourth PTP signals from the second network controller 5, generates a second 1PPS signal based on the fourth PTP signals, and outputs the second 1PPS signal to the second network controller 5 to enable the second network controller 5 to transfer the second 1PPS signal to the PLL unit 2 via a combination of the output pins (p3, p4) of the second network controller 5. The PLL unit 2 receives the recovered clock signal from the signal-adjusting device 4, receives the first 1PPS signal from the first network controller 3 via a combination of the fifth pin (P5) and the sixth pin (P6), receives the second 1PPS signal from the second network controller 5 via a combination of the seventh pin (P7) and the eighth pin (P8), and performs synchronization correction to generate the synchronizing signal based on the local oscillator signal, and one of the recovered clock signal, the first 1PPS signal and the second 1PPS signal. Then, the PLL unit 2 outputs the synchronizing signal to the first network controller 3 and the second network controller 5. Thereafter, the synchronization procedure is performed. Since details of the synchronization procedure have been described previously, detailed explanation of the same is omitted herein for the sake of brevity. In this way, the external devices that are electrically connected to the first transceivers 7 and the second transceivers 6 can be synchronized. It is worth to note that the processor 8 executes the "ptp4l" software program to generate the first 1PPS signal based on the retimer signal, and to generate the second 1PPS signal based on the fourth PTP signals.

In one embodiment, when the synchronizing system operates in the slave mode, the recovered clock signal, the first 1PPS signal and the second 1PPS signal respectively serve as three correction-reference signals that are each assigned an order of priority, and the PLL unit 2 performs the synchronization correction to generate the synchronizing signal based on the local oscillator signal and one of the correction-reference signals that is highest in the order of priority. For example, in a scenario where the recovered clock signal corresponds to a first priority, the first 1PPS signal corresponds to a second priority and the second 1PPS corresponds to a third priority, the PLL unit 2 would perform the synchronization correction to generate the synchronizing signal based on the local oscillator signal and the recovered clock signal when the recovered clock signal, the first 1PPS signal and the second 1PPS signal are all received. In the same scenario, the PLL unit 2 would perform the synchronization correction to generate the synchronizing signal based on the local oscillator signal and the first 1PPS signal when only the first 1PPS signal and the second 1PPS signal are received, and would perform the synchronization correction to generate the synchronizing signal based on the local oscillator signal and the second 1PPS signal when only the second 1PPS signal is received. Since each of the recovered clock signal, the first 1PPS signal and the second 1PPS signal can serve as the correction-reference signal for performing the synchronization correction, a situation where the synchronization correction cannot be performed due to lack of certain signals may be prevented.

It should be noted that in this embodiment as shown in FIG. 1, data transmission between the second network controller 5 and each of the first transceivers 7 follows the standard of 25 Gigabit Ethernet (25 GbE). The second network controller 5 delivers the second PTP signal to the first transceivers 7 that are four in total number. That is to say, the synchronizing system is capable of being electrically connected to eight SFP28 transceivers at most, i.e., four first transceivers 7 and four second transceivers 6.

Figure 2:
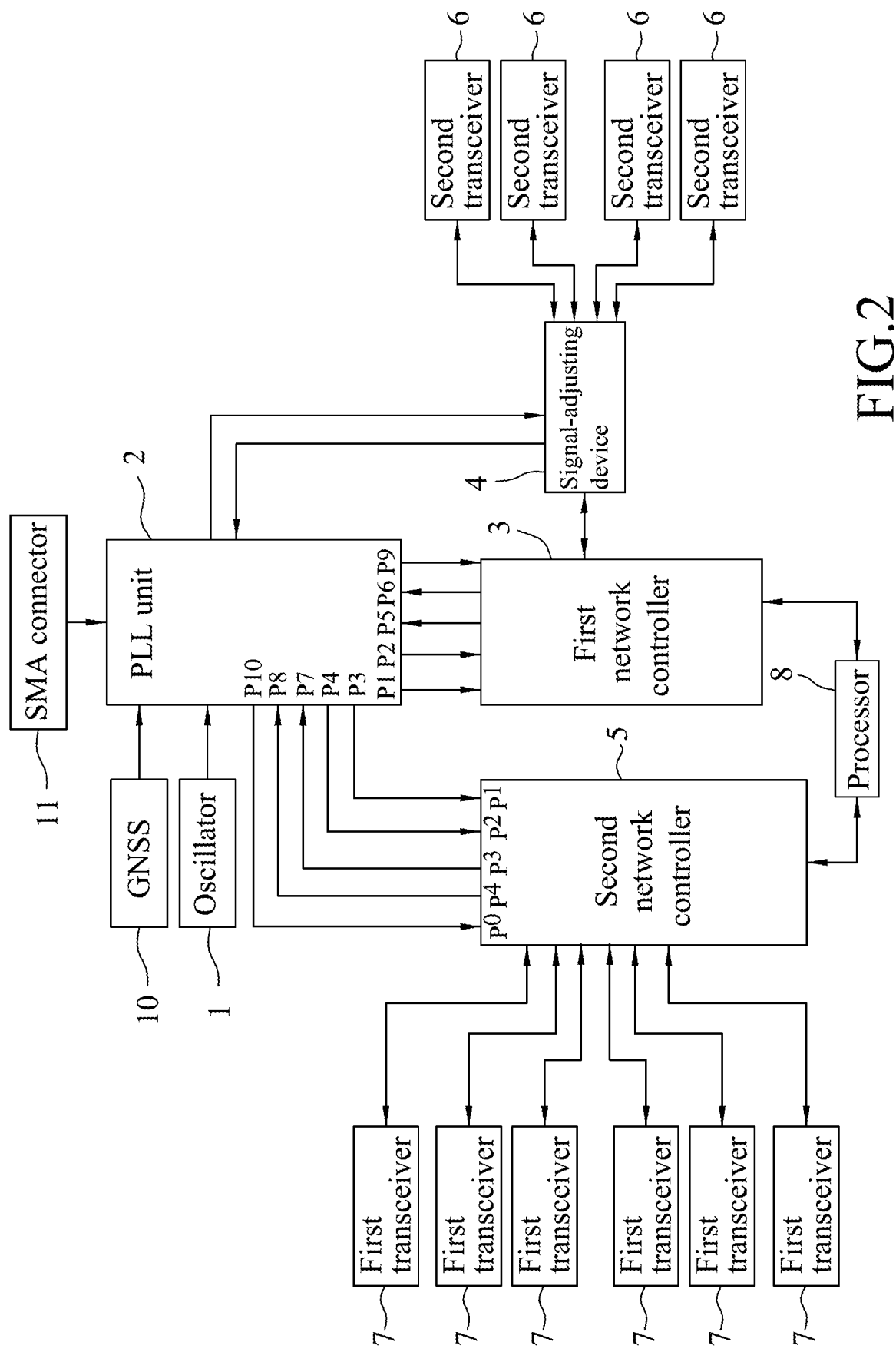
FIG. 2 is a block diagram illustrating another embodiment of the synchronizing system according to the disclosure.

Referring to FIG. 2, in another embodiment, data transmission between the second network controller 5 and one of the first transceivers 7 follows one of the standards of 25 Gigabit Ethernet (25 GbE) and 10 Gigabit Ethernet (10 GbE). Specifically, the second network controller 5 delivers the second PTP signal to the first transceivers 7 that are six in total number, where two of the first transceivers 7 support the standard of 25 GbE, and the other four of the first transceivers 7 support the standard of 10 GbE. It is worth to note that in this embodiment, the synchronizing system can be electrically connected to ten SFP28 transceivers at most, i.e., six first transceivers 7 and four second transceivers 6.

Figure 3:
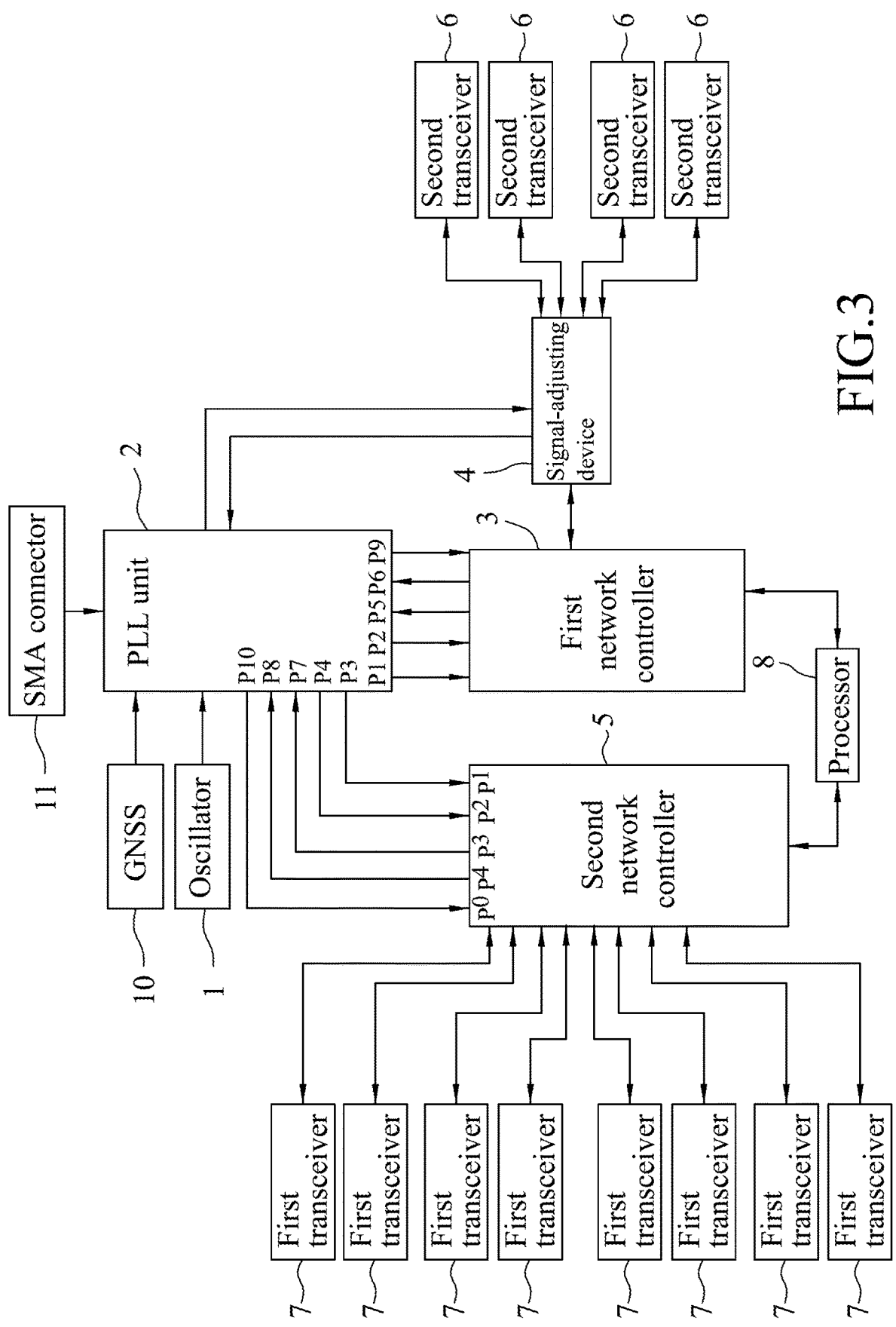
FIG. 3 is a block diagram illustrating still another embodiment of the synchronizing system according to the disclosure.

Referring to FIG. 3, in still another embodiment, data transmission between the second network controller 5 and each of the first transceivers 7 follows the standard of 10 Gigabit Ethernet (10 GbE). The second network controller 5 delivers the second PTP signal to the first transceivers 7 that are eight in total number. It is worth to note that in this embodiment, the synchronizing system can be electrically connected to twelve SFP28 transceivers at most, i.e., eight first transceivers 7 and four second transceivers 6.

To sum up, the synchronizing system according to the disclosure operates in one of the master mode and the slave mode. When the synchronizing system operates in the master mode, the PLL unit 2 generates the synchronizing signal based on the local oscillator signal received from the oscillator 1 and the reference time signal received from the GNSS 10, and outputs the synchronizing signal to the first network controller 3 and the second network controller 5. Then, the synchronization procedure is cooperatively performed by the first network controller 3, the second network controller 5 and the processor 8 to generate the first and second PTP signals based on the synchronization signal, and to deliver the first and second PTP signals via the signal-adjusting device 4, the first transceivers 7 and the second transceivers 6 to external devices for synchronization. When the synchronizing system operates in the slave mode, the external devices transmit the third and fourth PTP signals to the synchronizing system. The signal-adjusting device 4 generates the recovered clock signal based on the third PTP signals, and performs retiming on the third PTP signals to result in the retimer signal. The processor 8 generates the first 1PPS signal based on the retimer signal, and generates the second 1PPS signal based on the fourth PTP signals. The PLL unit 2 performs synchronization correction to generate the synchronizing signal based on the local oscillator signal, and based on one of the recovered clock signal, the first 1PPS signal and the second 1PPS signal, and provides the synchronizing signal to the first network controller 3 and the second network controller 5. Then, the synchronization procedure is performed to synchronize the external devices. Since multiple network controllers are included, the synchronizing system according to the disclosure is capable of connecting more transceivers and synchronizing more external devices than a conventional synchronizing system that includes only a single network controller. Moreover, each of the recovered clock signal, the first 1PPS signal and the second 1PPS signal can serve as the correction-reference signal for the PLL unit 2 to perform the synchronization correction, ensuring that the synchronizing system is robust in the event of lacking one or two correction-reference signals.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:
1. A synchronizing system, comprising:
a phase-locked loop (PLL) unit having a first pin, a second pin, a third pin and a fourth pin, and configured to receive a local oscillator signal, to generate and output a clock signal having an operating frequency, to generate a synchronizing signal, and to output the synchronizing signal via a combination of said first pin and said second pin and via a combination of said third pin and said fourth pin;
a first network controller electrically connected to said PLL unit, and configured to receive the clock signal and the synchronizing signal that is outputted via the combination of said first pin and said second pin of said PLL unit, to operate according to the clock signal, and to generate a first clock-event every second based on the synchronizing signal to result in a first clock-event signal;
a second network controller electrically connected to said PLL unit, and configured to receive the clock signal and the synchronizing signal, to operate according to the clock signal, and to generate a second clock-event every second based on the synchronizing signal to result in a second clock-event signal, said second network controller having two input pins respectively and electrically connected to said third pin and said fourth pin of said PLL unit for receiving the synchronizing signal;
a processor electrically connected to said first network controller and said second network controller, and configured to
receive the first clock-event signal from said first network controller,
generate, based on the first clock-event signal, a first Precision Time Protocol (PTP) signal that contains a first timestamp related to PTP,
transmit the first PTP signal to said first network controller to enable said first network controller to output the first PTP signal,
receive the second clock-event signal from said second network controller,
generate, based on the second clock-event signal, a second PTP signal that contains the first timestamp, and
transmit the second PTP signal to said second network controller to enable said second network controller to deliver the second PTP signal to a plurality of first transceivers for synchronization; and
a signal-adjusting device electrically connected to said PLL unit and said first network controller, and configured to receive the clock signal from said PLL unit and the first PTP signal from said first network controller, to operate according to the clock signal, to perform retiming on the first PTP signal, and to deliver the first PTP signal that is retimed to a plurality of second transceivers for synchronization;
wherein when said synchronizing system operates in a master mode with respect to generation of the synchronizing signal, said PLL unit receives a reference time signal from a global navigation satellite system (GNSS), generates the synchronizing signal based on the local oscillator signal and the reference time signal, and outputs the synchronizing signal to said first network controller and said second network controller.

2. The synchronizing system as claimed in claim 1, wherein:
said PLL unit further has a fifth pin, a sixth pin, a seventh pin and an eighth pin, said fifth pin and said sixth pin being electrically connected to said first network controller;
said second network controller further has two output pins that are respectively and electrically connected to said seventh pin and said eighth pin; and
when said synchronizing system operates in a slave mode with respect to generation of the synchronizing signal, said signal-adjusting device, in response to receipt of third PTP signals respectively from the second transceivers, wherein each of the third PTP signals contains a second timestamp related to PTP,
performs retiming on the third PTP signals to result in a retimer signal, and
generates, based on the third PTP signals, a recovered clock signal according to a Synchronous Ethernet (SyncE) standard,
said first network controller receives the retimer signal from said signal-adjusting device, and transfers the retimer signal to said processor,
said second network controller, in response to receipt of fourth PTP signals respectively from the first transceivers, transfers the fourth PTP signals to said processor, wherein each of the fourth PTP signals contains a third timestamp related to PTP,
said processor
receives the retimer signal from said first network controller,
generates a first pulse-per-second (1PPS) signal based on the retimer signal,
outputs the first 1PPS signal to said first network controller to enable said first network controller to transfer the first 1PPS to said PLL unit,
receives the fourth PTP signals from said second network controller,
generates a second 1PPS signal based on the fourth PTP signals, and
outputs the second 1PPS signal to said second network controller to enable said second network controller to transfer the second 1PPS signal to said PLL unit via a combination of said output pins of said second network controller, and
said PLL unit
receives the recovered clock signal from said signal-adjusting device,
receives the first 1PPS signal from said first network controller via a combination of said fifth pin and said sixth pin,
receives the second 1PPS signal from said second network controller via a combination of said seventh pin and said eighth pin,
performs synchronization correction to generate the synchronizing signal based on the local oscillator signal, and one of the recovered clock signal, the first 1PPS signal and the second 1PPS signal, and
outputs the synchronizing signal to said first network controller and said second network controller.

3. The synchronizing system as claimed in claim 2, wherein, when said synchronizing system operates in the slave mode:
the recovered clock signal, the first 1PPS signal and the second 1PPS signal respectively serve as three correction-reference signals that are each assigned an order of priority; and
said PLL unit performs the synchronization correction to generate the synchronizing signal based on the local oscillator signal and one of the correction-reference signals that is highest in the order of priority.

4. The synchronizing system as claimed in claim 2, wherein said first network controller has a software-defined pin 20 (SDP20) and a software-defined pin 22 (SDP22) that are respectively and electrically connected to said fifth pin and said sixth pin of said PLL unit, and said first network controller transfers the first 1PPS to said PLL unit via a combination of said SDP20 and SDP22 of said first network controller.

5. The synchronizing system as claimed in claim 2, wherein said output pins of said second network controller are respectively a software-defined pin 20 (SDP20) and a software-defined pin 22 (SDP22) of said second network controller.

6. The synchronizing system as claimed in claim 1, wherein said input pins of said second network controller are respectively a software-defined pin 21 (SDP21) and a software-defined pin 23 (SDP23) of said second network controller.

7. The synchronizing system as claimed in claim 1, wherein said signal-adjusting device is a retimer.

8. The synchronizing system as claimed in claim 1, further comprising:
an oscillator electrically connected to said PLL unit, and configured to generate the local oscillator signal, and to output the local oscillator signal to said PLL unit.

9. The synchronizing system as claimed in claim 8, wherein said oscillator is an oven controlled crystal oscillator (OCXO).

10. The synchronizing system as claimed in claim 1, wherein:
data transmission between said second network controller and each of the first transceivers follows the standard of 25 Gigabit Ethernet (25 GbE), said second network controller delivering the second PTP signal to the first transceivers that are four in total number.

11. The synchronizing system as claimed in claim 1, wherein:
data transmission between said second network controller and one of the first transceivers follows one of the standards of 25 Gigabit Ethernet (25 GbE) and 10 Gigabit Ethernet (10 GbE), said second network controller delivering the second PTP signal to the first transceivers that are six in total number, two of the first transceivers supporting the standard of 25 GbE, the other four of the first transceivers supporting the standard of 10 GbE.

12. The synchronizing system as claimed in claim 1, wherein:
data transmission between said second network controller and each of the first transceivers follows the standard of 10 Gigabit Ethernet (10 GbE), said second network controller delivering the second PTP signal to the first transceivers that are eight in total number.

13. The synchronizing system as claimed in claim 1, wherein said PLL unit is a digital phase-locked loop (DPLL).

14. The synchronizing system as claimed in claim 1, wherein each of said first network controller and said second network controller is an Ethernet controller.

15. The synchronizing system as claimed in claim 1, wherein when said synchronizing system operates in the master mode with respect to generation of the synchronizing signal, said PLL unit further receives a pulse-per-second (1PPS) signal via a subminiature version A (SMA) connector from a signal source, and generates the synchronizing signal based on the 1PPS signal, the local oscillator signal and the reference time signal.

16. The synchronizing system as claimed in claim 1, wherein said processor is configured to execute a software program to generate the first PTP signal based on the first clock-event signal and to generate the second PTP signal based on the second clock-event signal, the software program being implemented by the PTP for Linux (ptp41) open-source software.

17. The synchronizing system as claimed in claim 1, wherein the operating frequency of the clock signal is 156.25 MHz.

18. The synchronizing system as claimed in claim 1, wherein:
said PLL unit further has a ninth pin that is electrically connected to said first network controller and a tenth pin that is electrically connected to said second network controller; and
said PLL unit outputs the clock signal via said ninth pin and said tenth pin.

19. The synchronizing system as claimed in claim 1, wherein said second network controller further has an input pin that is electrically connected to said PLL unit for receiving the clock signal therefrom.

20. The synchronizing system as claimed in claim 1, wherein each of the first transceivers and the second transceivers is a small form-factor pluggable (SFP) transceiver.

* * * * *